United States Patent

Schmitz

[11] 4,348,745
[45] Sep. 7, 1982

[54] NON-VOLATILE RANDOM ACCESS MEMORY HAVING NON-INVERTED STORAGE

[75] Inventor: Lawrence S. Schmitz, Costa Mesa, Calif.

[73] Assignee: Hughes Aircraft Company, Culver City, Calif.

[21] Appl. No.: 200,758

[22] Filed: Oct. 27, 1980

[51] Int. Cl.³ .................... G11C 11/40; G11C 13/00
[52] U.S. Cl. .................................. 365/154; 365/190
[58] Field of Search ................ 365/154, 155, 189, 190

[56] References Cited

U.S. PATENT DOCUMENTS 4,262,340 4/1981 Sasaki et al. ................... 365/154

Primary Examiner—Terrell W. Fears
Attorney, Agent, or Firm—Robert M. Wallace; William H. MacAllister

[57] ABSTRACT

A non-volatile random access memory cell has two branches, each branch comprising a source-to-drain channel and a series load connected to the channel to define a node therebetween, each channel having an associated electron tunneling region, a floating gate overlying the channel and a control gate overlying the floating gate, the control gate of each of the branches connected to the node of the other branch and the floating gate of each of the branches overlying the electron tunneling region of the source-to-drain channel of the other branch. The resulting structure is a cross-coupled floating gate structure in which threshold voltage control of one floating gate tunneling metal oxide semiconductor (FATMOS) transistor is controlled by another FATMOS transistor, the two transistors comprising a single random access memory cell. Data may be written in either volatile or non-volatile mode in a state which is not inverted from that previously stored during volatile writing.

5 Claims, 3 Drawing Figures

NON-VOLATILE RANDOM ACCESS MEMORY HAVING NON-INVERTED STORAGE

TECHNICAL FIELD

This invention relates to non-volatile random access memories incorporating floating gate tunneling metal oxide semiconductor (FATMOS) transistors.

BACKGROUND OF THE INVENTION

Non-volatile random access memories typically comprise a latch having two branches, each branch including the source-to-drain channel of a FATMOS transistor including a floating gate overlying the drain and means permitting electron tunneling between the drain and the floating gate through the intervening insulation, each branch further including a series load device connected to the drain of the FATMOS transistor at a node therebetween. Each FATMOS transistor includes a control gate overlying the floating gate. Latching feedback is provided by connecting the control gate of the FATMOS transistor of each branch to the node of the opposite branch. The logic state of the latch is established by holding one node at a high voltage and holding the other at a low voltage, each of these voltages representing the logic bit to be stored and the complement of the logic bit to be stored, respectively. Thus, a logic 1 would be established by holding one node at a high voltage and holding the other node at a low voltage, while a logic 0 would be established by holding the one node at a low voltage and the other at a high voltage respectively. Non-volatile storage of a logic bit is accomplished by increasing the voltage applied across each of the branches so that electrons tunnel to one of the floating gates and, in some cases, discharge from the other floating gate. The result is that the threshold voltage of one of the FATMOS transistors is increased relative to the threshold voltage of the other FATMOS transistor. Thus, when the voltage applied to the latch is turned off, the information to be stored is not lost. Instead, when voltage is reapplied to the latch, the latch will assume a specific logic state dictated by the imbalance between the threshold voltages of the two FATMOS transistors.

A significant disadvantage of the latch is that the non-volatile data storage achieved through the threshold voltage imbalance between the two FATMOS transistors causes the latch, after a loss of power, to be powered up into the complement of the logic state previously stored on the latch. Accordingly, additional circuitry must be provided to complement the inverted logic state which the latch assumes when power is reapplied. Such additional circuitry consumes additional space on the semiconductive substrate on which the random access memory is formed, a significant disadvantage.

SUMMARY OF THE INVENTION

The necessity for additional circuit elements to complement the inverted logic state stored by non-volatile writing is eliminated in the present invention by providing a novel floating gate structure which is cross-coupled between the tunneling regions of the two FATMOS transistors of the memory latch in such a manner that the latch always powers up in the identical state previously stored during non-volatile writing. Whereas in the prior art the floating gate of each FATMOS transistor is charged through a tunneling region associated with the drain of that FATMOS transistor, in the present invention each FATMOS transistor is controlled by a floating gate which is charged through a tunneling region associated with the drain of the other FATMOS transistor.

The advantage of the invention is that non-volatile writing of a logic state in which one FATMOS transistor is turned off while the other is turned on causes the threshold voltage of the "off" FATMOS transistor to be increased while, in some cases, the threshold voltage of the "on" FATMOS transistor is decreased. In contrast, in the prior art memory latch referred to above, non-volatile writing of a logic state causes the threshold voltage of the "on" FATMOS transistor to be increased while, in some cases, the threshold voltage of the "off" FATMOS transistor is decreased, which disadvantageously causes the prior art memory latch to assume the complement of the stored logic state following the removal and reapplication of electrical power.

The invention includes any electrical circuit comprising one or a plurality of FATMOS transistors in which at least one floating gate is cross-coupled so that it controls the source-to-drain channel of one transistor but exchanges tunneling electrons with the drain (or channel) of another transistor. Alternatively, each floating gate may overlie the source-to-drain channel of a plurality of FATMOS transistors and receive tunneling electrons from the drains or channels of one or more other FATMOS transistors which may or may not be included in the group of FATMOS transistors controlled by the floating gate. This affords a versatility in performance not found in the prior art.

BRIEF DESCRIPTION OF THE DRAWINGS

The invention is best understood by reference to the accompanying drawings of which.

DETAILED DESCRIPTION OF THE DRAWINGS

Figure 1:
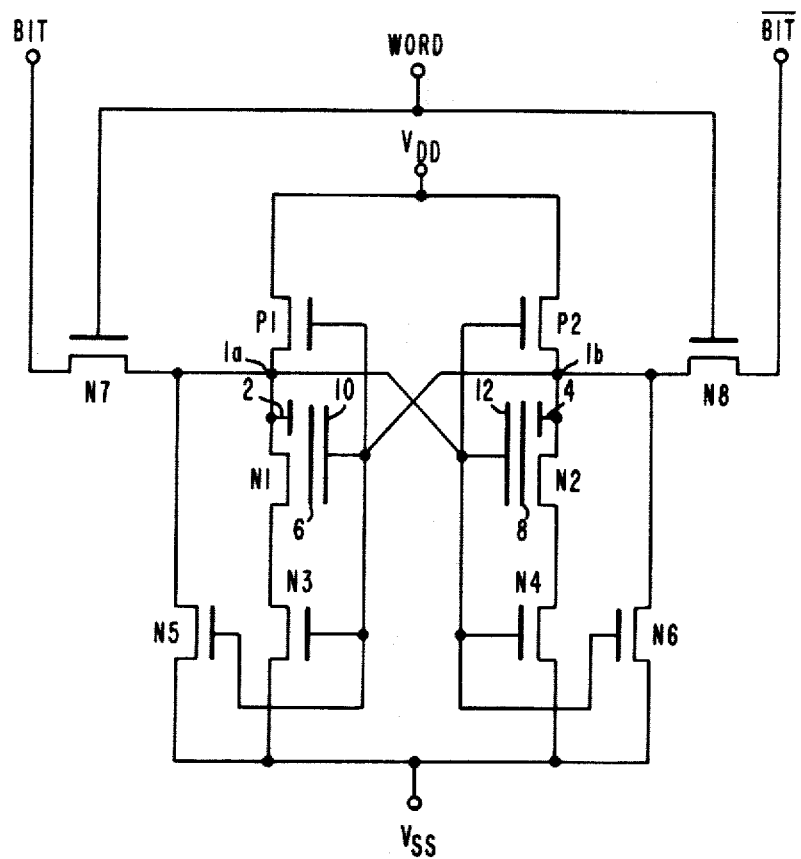
FIG. 1 is a simplified schematic diagram of a non-volatile random access memory cell of the prior art.

FIG. 1 illustrates a prior art memory cell disclosed in U.S. Pat. No. 4,126,773 filed Nov. 7, 1977 by Bruce Lee Troutman and Lawrence S. Schmitz and assigned to the assignee of the present application, the disclosure of which is incorporated herein by reference. In particular, FIG. 1 corresponds to the memory cell illustrated in FIG. 6 of the Troutman patent. The memory latch comprises two branches, one branch including an N-channel FATMOS transistor N1 connected in series with a load device comprising a P-channel MOS transistor P1. The other branch includes a second N-channel FATMOS transistor N2 connected in series with a resistive load device comprising a P-channel MOS transistor P2. The drains of the transistors N1 and P1 are connected together as are the drains of the transistors N2 and P2 at the branch nodes 1a, 1b respectively. The sources of the transistors P1, P2 are connected to a voltage source $V_{dd}$. The source of the FATMOS transistors N1, N2 are connected across transistors N3, N4 respectively to a voltage source $V_{ss}$. Transistors N5, N6 are connected in parallel with the transistors N1, N2 respectively. Latching feedback between the two branches is provided by connecting the node 1a of the first branch to the gates of the transistors P2, N2, N4 and N6 of the second branch and by connecting the node 1b of the second branch to the gates of the transistors P1, N1, N3 and N5 of the first branch, as indicated in FIG. 1. Addressing of the memory cell of FIG. 1 is provided by connection of the nodes 1a, 1b through MOS transistors N7, N8 to complementary data inputs BIT and $\overline{BIT}$ respectively, the gates of the addressing transistors N7, N8 being connected to the enable line WORD.

A logic bit may be stored in the memory cell of FIG. 1 in either a non-volatile mode or in a volatile mode. To store information in the volatile mode, the voltage source $V_{ss}$ is set at 0 volts while the voltage source $V_{dd}$ is set to +5 volts. A positive voltage is applied to the WORD line to enable the bit transistors N7, N8 so that data is written into the cell by applying +5 volts (corresponding to a logic 1) to one of the complementary data inputs while applying 0 volts (corresponding logic 0) to the other of the complementary data inputs. For example, if a logic 1 is to be stored in the latch of FIG. 1, the node 1a is held at a positive voltage while the node 1b is held at a relatively negative (ground). Therefore, the latching feedback provided between each branch node 1 and the gates of the transistors in the opposite branch cause the memory cell of FIG. 1 to latch into a logic state in which the node 1a is held at +5 volts while the node 1b is held at 0 volts. This is so because the negative (ground) voltage of the second branch node 1b applied to the gates of the transistors P1 and N1 in the first branch cause the transistor P1 to conduct while turning off conduction in the transistor N1 so that the voltage source $V_{dd}$ is connected through the transistor P1 to the branch node 1a. Also, the positive voltage applied from the first branch node 1a to the gates of the second branch transistors P2, N2 cuts off conduction in the transistor P2 while turning on conduction in the N-channel transistor N2. The memory cell remains latched in this state until the voltage sources $V_{dd}$, $V_{ss}$ are removed (at which time the information is lost) so that the information is stored in a temporary or "volatile" manner. Accordingly, the foregoing sequence of information storage will be referred to as volatile writing.

The information may also be stored in a non-volatile mode using the special features of the FATMOS transistors N1, N2 which permit their threshold voltages to be semipermanently altered. These features include, in the case of the FATMOS transistor N1, a tunneling region 2, an insulated floating gate 6 capacitively coupled through the tunneling region 2 to the drain of the FATMOS transistor N1 while being otherwise unconnected, and an overlying control gate 10, previously referred to as the gate of the transistor N1, coupled to the second branch node 1b. Likewise, the FATMOS transistor N2 includes a tunneling region 4, a floating gate 8 capacitively coupled through the tunneling region 4 to the drain of the FATMOS transistor N2 and an overlying control gate 12, previously referred to as the gate of the transistor N2, coupled to the first branch node 1a. Non-volatile storage of information is performed after the volatile writing step previously described. It will be remembered that, at the end of the volatile writing step described above in the previous example, the node 1a was latched at +5 volts while the node 1b was latched at 0 volts. Non-volatile writing of this logic state is accomplished by raising the voltage source $V_{dd}$ to +17 volts, which causes the voltage of the first branch node 1a to increase to +17 volts while the voltage of the second branch node 1b remains at 0 volts. Accordingly, the voltage of the overlying control gate 12 of the FATMOS transistor N2 is raised to +17 volts while the drain of the FATMOS transistor N2 is held to the ground voltage of the second branch node 1b. The electric field between the overlying control gate 12 and the drain of the transistor N2 is thus increased by a factor greater than three and so causes electrons to tunnel through the tunneling region 4 to the floating gate 8. As a result, the threshold voltage of the FATMOS transistor N2 is increased significantly in proportion to the number of electrons accumulated on its floating gate 8. The converse condition obtains in the opposite FATMOS transistor N1. Specifically, the control gate 10 is held to the ground voltage of the second branch node 1b while the drain of the FATMOS transistor N1 is held at +17 volts by virtue of its connection to the first branch node 1a. Accordingly, any electrons which may have been stored during a previous non-volatile writing step on the floating gate 6 are removed through the tunneling region 2 to the drain of the FATMOS transistor N1. If no electrons are previously stored on the floating gate 6, then there is no significant charge flow through the tunneling region 2. Accordingly, the threshold voltage of the FATMOS transistor N1 either remains unchanged or it decreases. The charge stored on the floating gates 6 an 8 remains after the voltage source $V_{dd}$ is decreased from the +17 volt level. Therefore, a semi-permanent imbalance between the threshold voltages of the FATMOS transistors N1, N2 is established during the non-volatile writing step. If power is removed from the memory cell of FIG. 1 and then is reapplied by holding the voltage source $V_{ss}$ at ground and holding the voltage source $V_{dd}$ at the nominal +5 volt level, the memory cell of FIG. 1 will latch into a state determined by the previous state of the memory cell existing during the non-volatile writing step. Specifically, because the threshold voltage of the FATMOS transistor N2 is greater than that of the threshold voltage of the FATMOS transistor N1, the source-to-drain current through the FATMOS transistor N1 will be greater, causing an imbalance in the voltage at the nodes 1a, 1b which will increase until the transistor N2 has been latched completely "off" and the transistor N1 is latched "on". Accordingly, the voltage at node 1a will approach 0 volts while the voltage at the node 1b will approach +5 volts, which is the exact complement of the state previously stored during the non-volatile writing step. Thus, the logic state is inverted from the state originally stored. As a result, some additional circuitry is needed to complement the inverted logic state created by the non-volatile writing step following any subsequent interruption of electrical power. The requirement for the additional circuitry (not shown in FIG. 1) is a significant disadvantage.

The function of the transistors N3, N4, N5 and N6 is set forth in the above-referenced Troutman and Schmitz patent and will not be discussed in detail herein. Briefly, the transistors N3, N4 serve to limit the current consumption of the memory cell while the transistors N5, N6 permit operation of the memory cell in the volatile mode previously described even if an excessive amount of charge has been stored on either of the floating gates 6 or 8.

Figure 2:
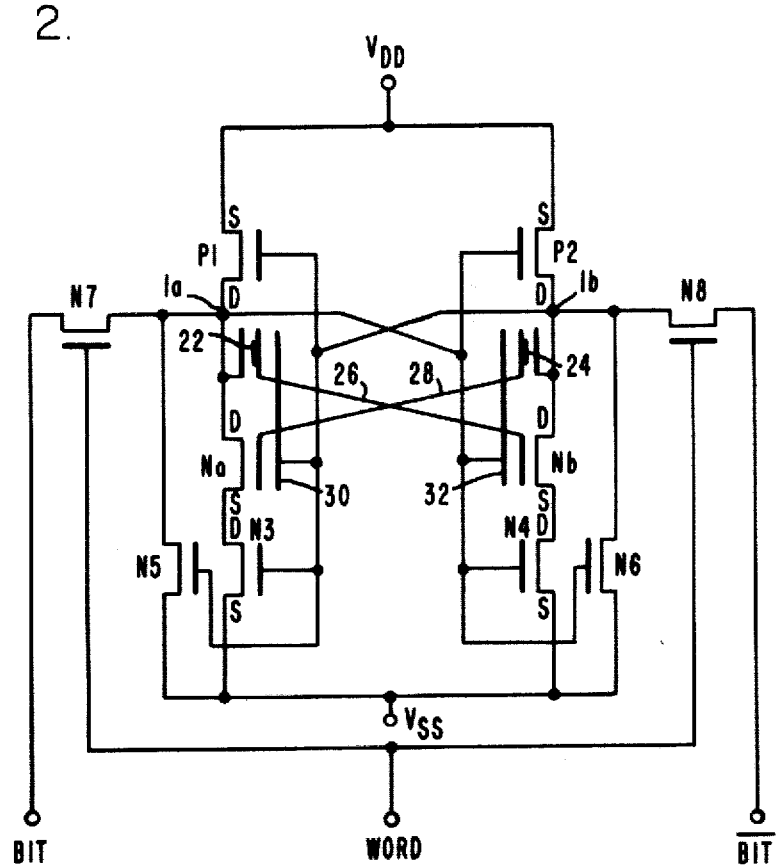
FIG. 2 is a simplified schematic diagram of the non-volatile random access memory cell of the present invention.

The invention is illustrated in FIG. 2 in which the disadvantage of non-volatile writing of the inverted logic state is completely overcome so that the latch responds to the non-volatile writing step by assuming the non-inverted logic state following an interruption of electrical power. In the novel memory cell of FIG. 2, the FATMOS transistor pair N1, N2 are replaced by the FATMOS transistor pair Na, Nb having cross-coupled floating gates 26, 28 each capacitively coupled through tunneling regions 22, 24 to the drains of the FATMOS transistors Na, Nb respectively, but overlying the source-to-drain channel of the opposite FATMOS transistor Nb, Na respectively. The transistors Na, Nb include overlying control gates 30, 32 respectively. All other elements of the memory cell of FIG. 2 are identical to the corresponding elements of the prior art memory cell of FIG. 1. Storage of data in the volatile mode is accomplished in the same manner as described above in connection with the prior art memory cell of FIG. 1. Storage of data in the non-volatile mode is also accomplished in the same manner as described above in connection with FIG. 1, with the exception that the cross-coupled structure of the floating gates 26, 28 causes electrons tunneling from the drain of each transistor Na, Nb to change the threshold voltage of the other. As a result, following a temporary power loss, the memory cell of FIG. 2 latches into a logic state which is not inverted from that obtaining during a previous non-volatile writing step.

In the novel memory cell of FIG. 2 volatile writing of data is accomplished by holding the voltage source $V_{ss}$ at 0 volts while holding the voltage source $V_{dd}$ at $+5$ volts. If the WORD line is held at $+5$ volts, the BIT line held at $+5$ volts and the $\overline{BIT}$ line held at 0 volts, corresponding to a volatile writing of a logic "1", then the first branch node $1a$ will be held at $+5$ volts while the second branch node $1b$ will be held at 0 volts and the memory cell of FIG. 2 will latch so as to maintain the foregoing node voltages. Subsequently, if it is desired to store this logic "1" in a non-volatile mode, the voltage source $V_{dd}$ is raised to $+17$ volts. Because the nodes $1a$, $1b$ are held at relatively positive and negative voltages respectively, the transistors P1 and P2 are latched in the "on" and "off" states respectively. Accordingly, the drain of the FATMOS transistor Na is held at $+17$ volts while the drain of the FATMOS transistor Nb is held at 0 volts. Also, the overlying control gates 30 and 32 are held at 0 volts and 17 volts respectively. Accordingly, an attractive 17 volt potential difference exists across the tunneling region 24 from the drain of the FATMOS transistor Nb (held at 0 volts) to the overlying control gate 32 (held at $+17$ volts). Therefore, electrons tunnel from the drain of the FATMOS transistor Nb through the tunneling region 24 to the floating gate 28. As a result, the floating gate 28 acquires a negative charge which exerts a negative electrical field across the channel of the other FATMOS transistor Na, thus raising its threshold voltage. Conversely, the threshold voltage of the FATMOS transistor Nb is not increased because there is no attraction of electrons to its floating gate 26 across the tunneling region 22. Instead the drain of the FATMOS transistor Na is held at an attractive 17 volt potential while the overlying control gate is held at ground potential. Thus, any electrons previously stored on the floating gate 26 tunnel through the tunneling region 22 to the drain of the FATMOS transistor Na.

After the 17 volt potential has been removed from the voltage source $V_{dd}$, electrons which tunneled to the floating gate 28 are permanently stored thereon and create an imbalance between the threshold voltages of FATMOS transistors Na and Nb. Thus, if power is temporarily removed from the circuit of FIG. 2 and then reapplied by setting the voltage source $V_{dd}$ to the nominal $+5$ volt potential and the voltage source $V_{ss}$ to ground, the voltage drop across the FATMOS transistor Na will be greater than that across the FATMOS transistor Nb, causing the memory cell of FIG. 2 to latch the voltage at the first branch node $1a$ to $+5$ volts and the voltage at the second branch node $1b$ at 0 volts. As a result, the memory cell of FIG. 2 assumes the same logic state (logic "1") which was previously stored before the loss of power. Thus, there is no need for additional circuitry to complement the inverted logic state generated by non-volatile writing in the prior art memory cell of FIG. 1. Elimination of the requirement for additional circuitry reduces the complexity and cost of the circuit while increasing the density of memory cells formed on the semiconductive substrate.

Figure 3:
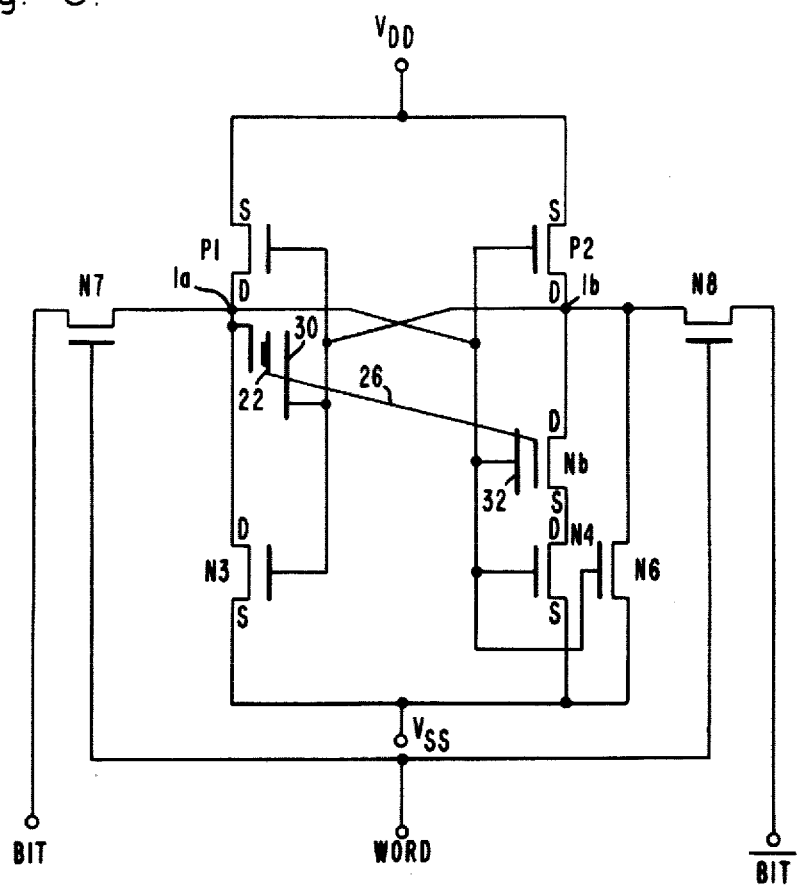
FIG. 3 is a simplified schematic diagram of the presently preferred embodiment of the invention.

FIG. 3 is a schematic diagram of the presently preferred embodiment of the invention and is the same as the circuit of FIG. 2 except that the FATMOS transistor Na is eliminated to save space, along with the transistor N5. Also, the tunneling region 22 overlies the drain of the transistor P1 in the preferred embodiment of FIG. 3. It should be noted that in the alternative embodiment of FIG. 2, the drains of the transistors P1 and Na are directly connected to the same branch node $1a$. Thus, in both the embodiment of FIG. 2 and in the preferred embodiment of FIG. 3 (in which the FATMOS transistor Na is removed), the tunneling region 22 always overlies a drain diffusion which is connected to the branch node $1a$. Accordingly, the structure and operation of the circuits of FIGS. 2 and 3 are equivalent.

In general, it is not absolutely necessary for the tunneling region 22 to overlie a drain diffusion (or a source diffusion). For example, if CMOS FATMOS transistors (of the type disclosed in U.S. patent Application Ser. No. 138,806 entitled "Electrically Erasable Programmable Read Only Memory", filed Apr. 9, 1980 by Frank M. Wanlass and assigned to the assignee of this application) are used in place of the FATMOS transistors Na, Nb discussed earlier in this application, then each of the tunneling regions 22, 24 in the embodiment of FIG. 2 would overlie the channel adjacent the correspoding drain rather than the drain itself. Thus, it may be stated generally that the tunneling region overlies the source-drain channel, meaning that it overlies one of the source-drain diffusions or the channel therebetween.

It should be apparent from the foregoing that other circuits may be made using the principle of the invention in which a plurality of FATMOS transistors are used having a plurality of floating gates which are cross-coupled, some of the floating gates being charged from the drains of some of the FATMOS transistors and controlling the source-to-drain channels of others of the FATMOS transistors. It is possible, for example, for a single floating gate to control source-to-drain conductivity in more than one source-to-drain channel or alternatively, to be charged from the drain of more than one FATMOS transistor.

What is claimed is:

1. A latch having two branches, each branch comprising a source-drain channel and a series load connected to said source-drain channel to define a node therebetween, the source-drain channel of at least one of said two branches underlying an electron tunneling region, a floating gate overlying the channel of the other branch and overlying said tunneling region, and a control gate at least partially overlying said one channel and said tunneling region and said floating gate, said control gate connected to the node of the other branch.

2. The latch of claim 1 wherein each source-drain channel comprises a source and a drain and a region lying therebetween.

3. In a latch having two branches, each branch comprising a source-drain channel with a series load connected thereto to define a node therebetween and a voltage source connected across each of the branches, the channel of at least one of said branches having an associated electron tunneling region, a floating gate overlying said tunneling region and overlying the source-drain channel of the other of said branches, and a control gate overlying said tunnelling region and said floating gate, a method for performing nonvolatile storage of a logic bit comprising:

holding one of said nodes at a voltage level corresponding to the logic bit while holding the other node at a voltage level corresponding to the complement of said bit so that one of said channels conducts charge while the other does not; and changing the resistance to charge flow in said other channel by increasing the magnitude of the voltage source connected across said branches to cause electrons to tunnel across said tunneling region so as to change the amount of charge stored on said floating gate in accordance with the voltage levels of said nodes.

4. A latch comprising first and second branches connected in parallel with one another between two voltage sources, (A) each of said branches comprising:
 (1) a first field effect transistor having a source and a drain and a first channel therebetween;
(B) at least one of said branches further comprising:
 (1) a floating electrode including means permitting charge to tunnel between said floating electrode and said one branch; and
 (2) a commonly connected electrode set overlying at least said floating electrode and said first channel and connected to the drain of the other branch; and
(C) at least the other of said branches further comprising:
 (1) a floating gate field effect transistor comprising a second source-drain channel connected to said drain of said other branch; and
 (2) a commonly connected electrode set overlying said first and second channels of said other branch and connected to the drain of said one branch; and
(D) said floating electrode of said one branch at least partially overlying said second channel of said other branch and each of said channels in each of said branches being connected in series combination.

5. The latch of claim 4 wherein each of said first and second branches includes its own floating gate field effect transistor including a second channel and a floating gate overlying the drain of the same channel and overlying the second channel of the other branch.

* * * * *